United States Patent [19]
Lee et al.

[11] Patent Number: 5,434,538
[45] Date of Patent: Jul. 18, 1995

[54] GAIN ENHANCEMENT FOR AMPLIFIER USING A REPLICA AMPLIFIER

[75] Inventors: Hae-Seung Lee, Arlington; Paul C. Yu, Cambridge, both of Mass.

[73] Assignee: Massachusetts Institute of Technology, Cambridge, Mass.

[21] Appl. No.: 122,377

[22] Filed: Sep. 16, 1993

[30] Foreign Application Priority Data

Sep. 17, 1992 [GB] United Kingdom ............... 9219685

[51] Int. Cl.⁶ ............................................. H03F 3/68
[52] U.S. Cl. ................................ 330/84; 330/124 R; 330/149; 330/295
[58] Field of Search ................ 330/84, 124 R, 148, 330/149, 151, 253, 295, 311

[56] References Cited

U.S. PATENT DOCUMENTS

| | | |
|---|---|---|
| 3,944,944 | 3/1976 | Ellenbecker ................... 330/149 |
| 4,794,349 | 12/1988 | Senderowicz et al. ........... 330/253 |
| 5,153,529 | 10/1992 | Koda et al. ................... 330/295 |

Primary Examiner—James B. Mullins
Attorney, Agent, or Firm—Wolf, Greenfield & Sacks

[57] ABSTRACT

A main amplifier has an enhanced gain due to current injection from a replica amplifier which has a similar structure and feedback network to that of the main amplifier. The main amplifier has a transconductance stage and an output resistance stage. A coupling transconductance stage receives the same input signal as that received by the main and replica amplifiers and injects a current to the output node of the main amplifier. The injected current is the same as the current to the output node would have been from the main amplifier's transconductance stage, were the replica amplifier not present. The gain can be obtained without a cascode and with short-channel CMOS technology that operates at a low supply voltage. The gain is increased without causing an increase in the output resistance, and without causing a decrease in the common-mode input range or the output swing.

40 Claims, 11 Drawing Sheets

GAIN ENHANCEMENT FOR AMPLIFIER USING A REPLICA AMPLIFIER

STATEMENT OF RIGHTS BASED ON FEDERAL GOVERNMENT FUNDING

This project was supported by NSF and DARPA under contract MIP-88-14612, and by NSF under contract MIP-91-17724.

FIELD OF THE INVENTION

This invention relates to amplifiers, and more particularly, to a gain enhancement technique for an amplifier. The amplifier preferably is electronic, but it may be mechanical or otherwise non-electrical.

BACKGROUND OF THE INVENTION

Operational amplifiers typically require high open-loop gain and high bandwidth to minimize errors in output voltage. Obtaining high open-loop gain is difficult in modern MOS amplifiers, however, due to the small intrinsic gain of short-channel MOS transistors. Long-channel transistors can improve gain, but bandwidth is sacrificed.

Positive feedback or cascode amplifiers, such as regular cascode, double cascode, and active cascode, can improve gain, but the output swing and input common-mode range are concomitantly reduced, as is generally known in the art. The reduction in output swing (often termed "compliance" or increase of "headroom" relative to the power supply) is a problem, particularly in low voltage applications. In this context, another problem with using cascode circuits for improving gain is that the output resistance of the amplifier is increased, and this makes it more difficult for the amplifier to drive a resistive load.

SUMMARY OF THE INVENTION

According to the invention, these problems are addressed by an amplifier which may be modelled as having a first stage, a second stage, and a correction circuit. As used herein, the term "stage" is not meant to necessarily imply or indicate a discrete collection of components, such as transistors or resistors; rather, a single component may, for example, form all or part of the first and all or part of the second stage (as will be apparent from the Detailed Description below). Furthermore, a "stage" may be an implicit function of a component which is part of another stage. The first stage receives an input signal from an input source, and provides a first stage output signal. The correction circuit receives an input signal similar to the input signal received by the first stage, and provides a correction circuit output signal. The correction circuit output signal and the first stage output signal are then combined and provided to the second stage, which generates the amplifier's output signal.

In an embodiment of the present invention, the correction circuit has its own first and second stages which are substantially similar to the aforesaid first and second stages (hereafter, the "main amplifier first stage" and the "main amplifier second stage", respectively; the term "main amplifier" shall be used to refer in the aggregate to the main amplifier first stage and main amplifier second stage), and a coupling stage which is also similar to the main amplifier first stage. Each of the correction circuit and the main amplifier has a feedback circuit, and the two feedback circuits are substantially similar to each other. When a similar input is provided to the correction circuit as is provided to the main amplifier, the coupling stage of the correction circuit provides an output which is about the same as that which would have been provided by the first stage without the correction circuit. With the correction circuit, the output from the first stage is much smaller than the output from the correction circuit. The two outputs are combined and provided to the second stage.

Preferably, the first stage of the main amplifier includes a transconductance element and the correction circuit includes a similar transconductance element in its first stage and a like transconductance element in the coupling stage. The coupling stage receives the same signal as is input to the transconductance stage of the second amplifier and provides an output current to a summing node at the output of the main amplifier transconductance element. If the transconductance values for each transconductance stage are about the same, then the coupling stage provides a current which is about equal to what the current would have been from the transconductance element of the main amplifier were it not for the presence of the correction circuit (i.e., were the correction circuit absent).

The transconductance stage of the main amplifier need not necessarily match the coupling stage transconductance or the correction circuit second stage transconductance. The current provided by the coupling stage should, however, result in an output voltage which is the same as the output voltage from the replica amplifier. Accordingly, the product of the transconductance of the coupling stage and the output resistance of the main amplifier should be about the same as the open loop gain of the replica amplifier, where the open-loop gain is the product of the transconductance and the output resistance.

Because the coupling stage has an electrical effect (e.g., loading) on the transconductance element of the main amplifier, the correction circuit further includes mimicking circuitry which mimics these electrical effects on the transconductance element of the correction circuit.

The amplifier provided by the first and second stages of the correction circuit (hereafter the "replica amplifier") may be identical to the main amplifier, may be a scaled version, or may be different and even have different polarity transistors. Both the main and replica amplifiers have second stages comprising output resistances. In a scaled version, if the transconductance stage and the output resistance stage of the replica amplifier are substantially similar to the corresponding stages of the main amplifier, the transconductance provided by the transconductance element of the replica amplifier is decreased by a factor of N and the output resistance is increased by the same factor N. By decreasing the transconductance and increasing the output resistance, chip space can be saved while keeping the open loop gains equal.

Each amplifier may have a feedback network with a source impedance and a feedback impedance. The ratios of the two feedback impedances to the respective source impedances should be matched as closely as possible. The replica amplifier impedances can be identical to the main amplifier impedances, or they can be scaled, so long as the same ratio is maintained.

A circuit according to the present invention provides an increase in gain, without a loss in the output swing.

Since the output swing is important in circuit applications with a low voltage power supply, this circuit is suitable for applications with a low supply voltage range, e.g, two volts. The circuit can be used with other elements, such as a cascode transistor, and with additional stages in the amplifiers.

BRIEF DESCRIPTION OF THE DRAWINGS

Other objects, features, and advantages will become apparent from the following description of embodiments and from the claims when read in conjunction with the appended drawings in which:

DETAILED DESCRIPTION

Figure 1:
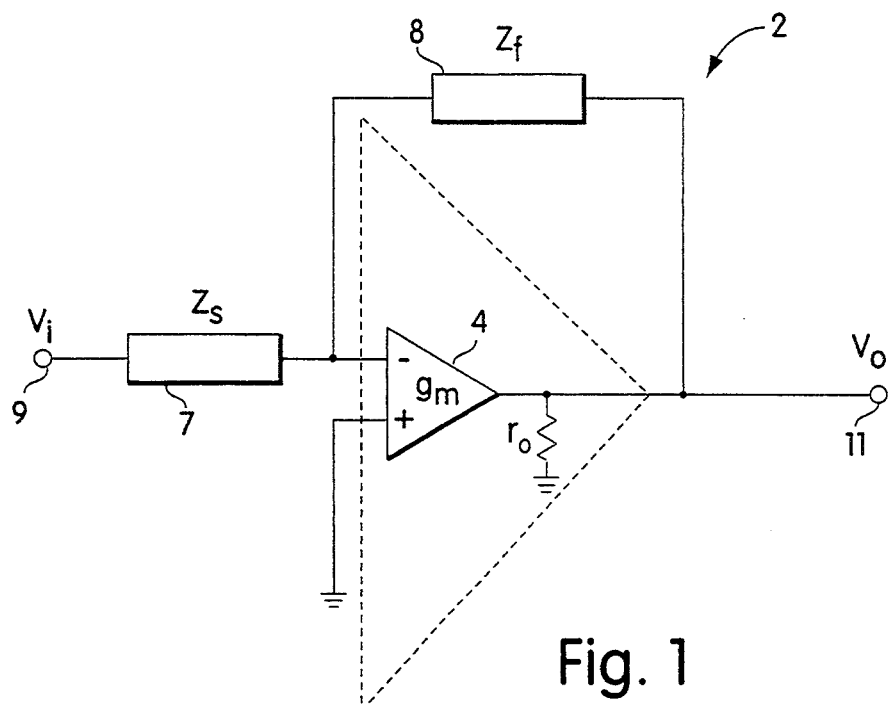
FIG. 1 is a partially schematic, partially block diagram model of a prior art amplifier with feedback.

Referring to FIG. 1, an amplifier 2 with a single amplifying stage topology can be generally modelled as a transconductance element 4, constituting a first stage, and an output resistance 6, constituting a second stage. A feedback network couples an input terminal 9 to the first stage and an output terminal 11 from the second stage. The feedback network includes a source impedance 7, of value $Z_s$, and a feedback impedance 8, of value $Z_f$.

The ideal closed-loop gain of the amplifier is expressed as $V_o/V_i = -Z_f/Z_s = -(\text{beta})$ (for frequencies below a certain break point frequency). This ideal gain relationship assumes that the open-loop gain of the amplifier, $A_o = (g_m)(r_o)$, is infinite, where $g_m$ is the amplifier transconductance and $r_o$ is an intrinsic output resistance. In practice, however, open-loop gain is finite, producing an error factor of $(1+\text{beta})/A_o$, so that the actual gain is $(\text{beta})/(1+\text{error})$, where "error" is the error factor. As this equation indicates, the greater the error, the lower the actual gain.

Figure 2:
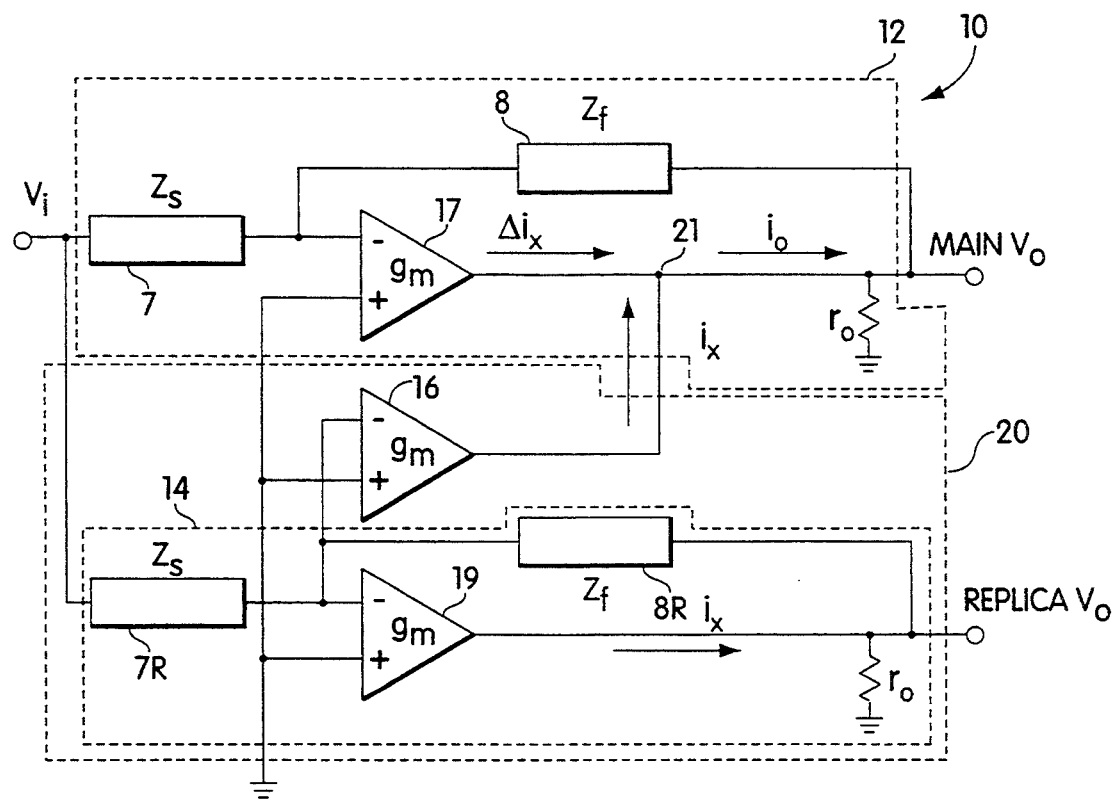
FIG. 2 is partially schematic, partially block diagram of an embodiment of the present invention.

Referring to FIG. 2, an amplifier assembly 10 according to the invention has a main amplifier 12 and a correction circuit 20. The correction circuit includes a replica amplifier 14 and a transconductance coupling stage 16. Replica amplifier 14 has a feedback network 7R, 8R which is substantially similar to the feedback network 7, 8 in main amplifier 12. In this embodiment, coupling stage 16 includes a transconductance element which has the same transconductance $g_m$ as that of transconductance stage 17 of the main amplifier and transconductance stage 19 of the replica amplifier. As a result, coupling stage 16 provides an output current $i_x$ which has the same value as the current from transconductance stage 19 of the replica amplifier. This current would also have been the output of main amplifier transconductance stage 17 in the absence of correction circuit 20. As a result, current $i_x$, which is injected from the replica amplifier to summing node 21 of the main amplifier (at the input to the output resistance stage), is close to the total current needed to bring output Main $V_o$ of the main amplifier 12 to an ideal output voltage. Consequently, the current needed from the transconductance stage 17 of the main amplifier, $\Delta i_x$, is much smaller than the output of transconductance stage 4 in FIG. 1, and represents a portion of the additional current needed to bring the current $i_x$ of the replica amplifier 14 up to the ideal output current.

The effective open-loop gain of the main amplifier is significantly increased by this technique, so that the error can be shown to be $((1+\text{beta})/A_o)^2$. Comparing this error with the error of an amplifier without a replica as discussed above, the error is effectively reduced by a factor of $A_o/(1+\text{beta})$, thus increasing the effective open-loop gain by this factor. If beta is small relative to $A_o$, as is typically true, there is a substantial increase in the open-loop gain.

Figure 3:
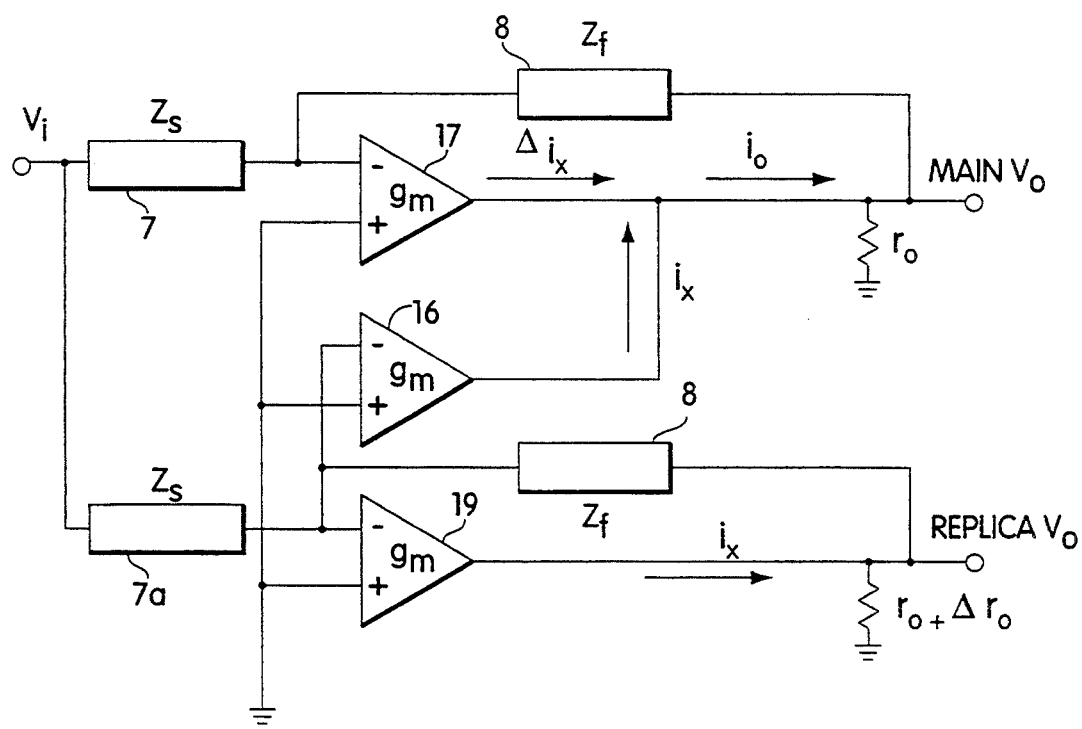
FIG. 3 is a similar diagram of the embodiment of FIG. 2, but labeled to indicate mismatch.

Preferably, the main amplifier and the replica amplifier are matched as closely as possible, since mismatch reduces the gain. Referring to FIG. 3, for example, if the transconductances have equal value and if the output resistance of the replica amplifier is $r_o + \Delta r_o$, the effective gain is limited to $A_o (r_o/\Delta r_o)$. Consequently, if there is a 5% mismatch for example, the gain improvement is limited to a factor of 20.

Figure 4:
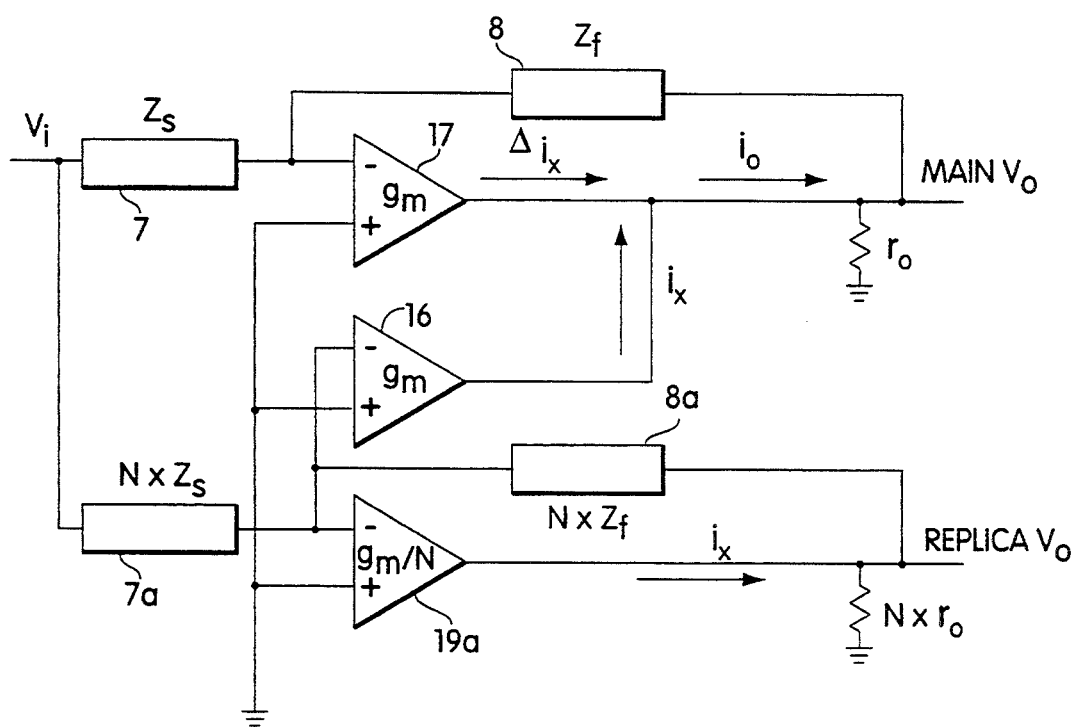
FIG. 4 is a similar diagram of the embodiment of FIG. 2 with a scaled replica amplifier.

Referring to FIG. 4, the replica amplifier does not necessarily have to be identical to the main amplifier, but rather, can be scaled down in size and power without detracting from the effectiveness of the gain enhancement technique. To scale down by a factor of N, transconductance stage 19a has a transconductance of $g_m/N$ and output resistance $(r_o)(N)$; the impedances 7a, 8a are scaled to $(N)(Z_s)$ and $(N)(Z_f)$, respectively. Beta and $A_o$ are thus the same as for the non-scaled embodiment of FIG. 2. Accordingly, the two feedback networks and the two amplifiers may be substantially similar to each other even though they may have different values. By scaling the output resistance and feedback impedances by the same factor, certain parasitic effects can be minimized. The scaled down embodiment is beneficial since it can take up less space on a chip when fabricated, and can reduce power consumption.

When a square pulse or a step voltage is presented at the input to an amplifier, generally it is desired that the output settle as quickly as possible. If the unity-gain bandwidth of the replica amplifier is made equal to that of the main amplifier, however, there is an increase of about 20% in the settling time due to a pole-zero pair introduced near the closed loop bandwidth of the circuit. This effect can be removed by making the unity-gain bandwidth of the replica amplifier greater than that of the main amplifier. Since the replica amplifier typically does not have to drive large capacitive loads, it is easy to make the unity-gain bandwidth of the replica amplifier higher than that of the main amplifier, which may be required to drive considerable capacitive loads.

Figure 5A:
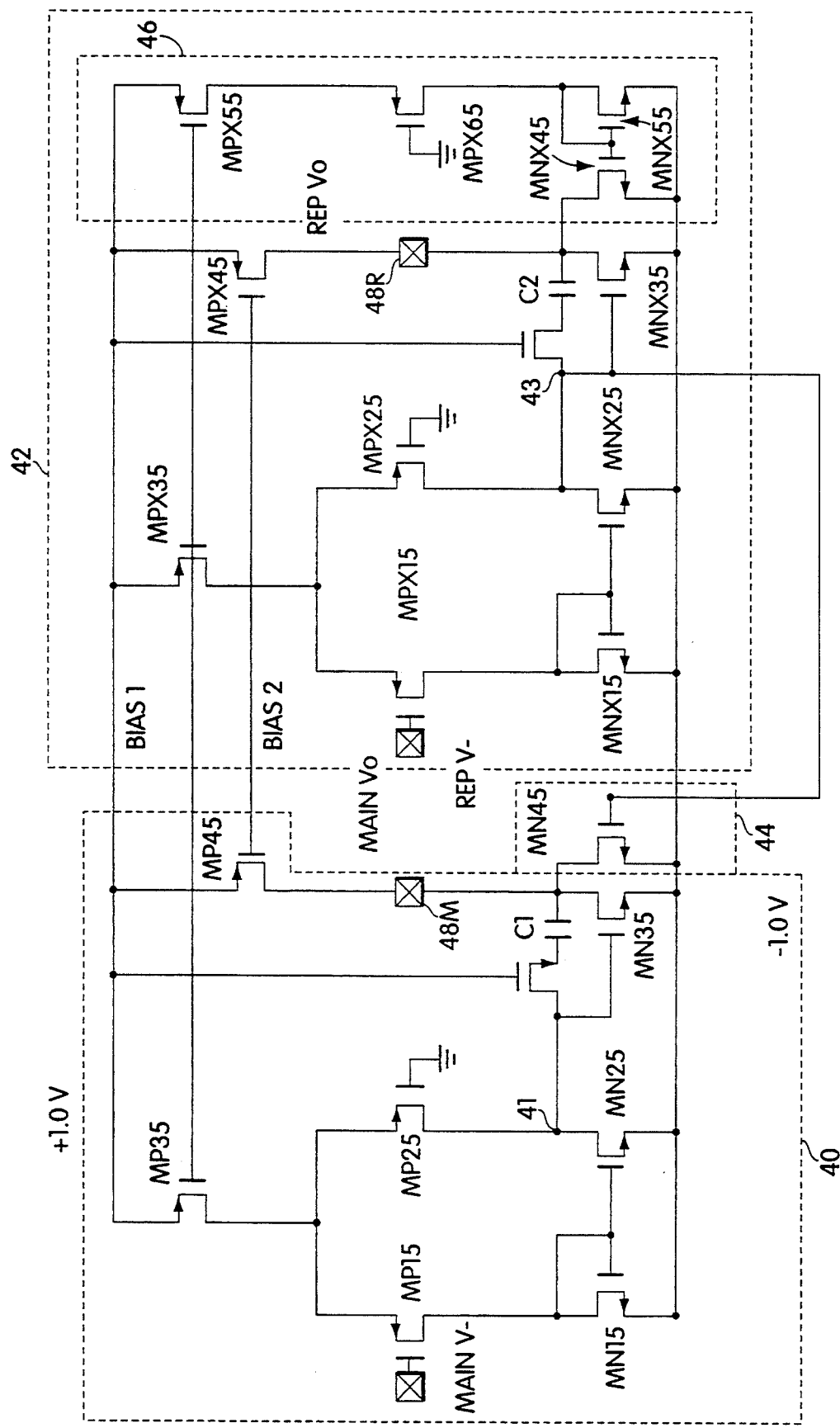
FIG. 5(a) is a schematic circuit diagram for an implementation of another embodiment of the present invention.

Referring to FIG. 5(a), an exemplary CMOS circuit implementation of the invention (exclusive of feedback networks) includes a main amplifier 40, a replica amplifier 42, and a coupling transconductance stage 44 which is MOSFET MN45. Since transistors MNX35 and MN45 are matched, if no voltage is applied to the inputs of the main amplifier, Main V, the output of the main amplifier 40, Main $V_o$, is the same as the replica output, Replica $V_o$, which is already close to the desired output voltage, as described above.

In this example, the first transconductance stage and the first output resistance stage provide a voltage at node 41. Transistors MN35 and MN45 convert input voltages from node 41 and from node 43, respectively, to an output current at the combined drain of the transistors. The output resistance is implicit looking into the drains of transistors MN35, MN45, and MP45 which are in parallel. The product of the output current and the output resistance is the main amplifier output voltage 48M.

Figure 5B:
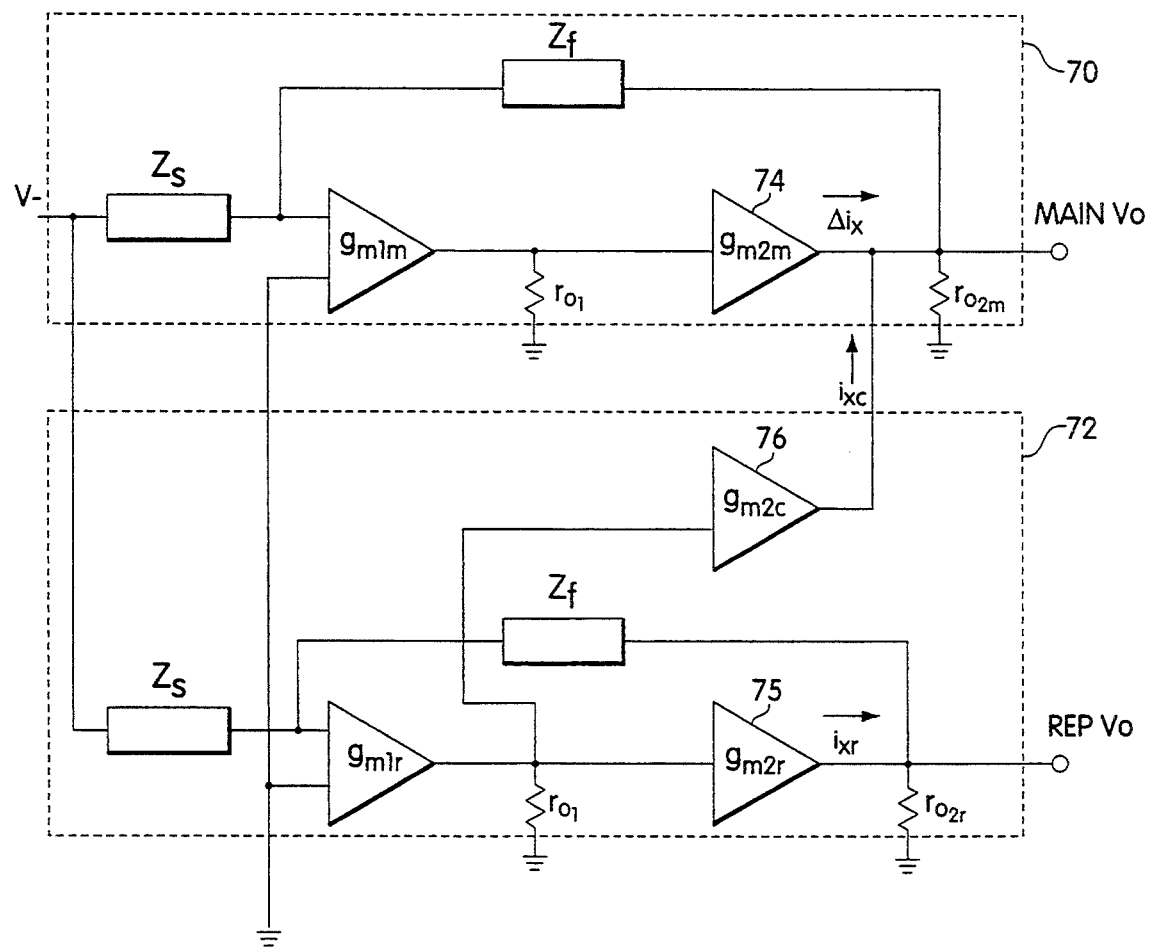
FIG. 5(b) is a partially schematic, partially block diagram of a portion of the circuitry in FIG. 5.

Referring to FIG. 5(b), an amplifier, such as that shown in FIG. 5(a), may be referred to as having a two-stage topology, where each amplifying "stage" includes a transconductance stage and an output resistance stage. As discussed above, the term "stage" is used broadly to include each transconductance stage, $g_{mlm}$ and $g_{mlr}$ and each output resistance stage, $r_{o1}$ and $r_{o2}$, individually, or the combination of a transconductance stage and an output resistance stage. In this representation of the two-stage topology, a correction circuit 72 provides current $i_{xc}$ to the output of a second transconductance stage 74 of a main amplifier 70.

While transconductance stages 74, 75, and 76 can be matched so that $g_{m2m}=g_{m2c}=g_{m2r}$, and $r_{o2m}=r_{o2r}$, these equalities are not required. It is important, however, that the output voltage produced by the coupling current $i_{xc}$ be substantially similar to Replica $V_o$. Accordingly, $(g_{m2c})(r_{o2m})=(g_{m2r})(r_{o2r})$. As the mismatch between the main and replica amplifiers increases, the improvement in open-loop gain is correspondingly reduced.

Referring again to FIG. 5(a), mimicking circuitry 46 is provided to better maintain a match between main amplifier 40 and replica amplifier 42. Transconductance stage 44, which includes transistor MN45, has an effect on main amplifier 40 since it has a common drain with transistor MN35. Transistor MNX45 is added to share a common drain with transistor MNX35, and thus to match the effect of transistor MN45 on main amplifier transistor MN35. Transistors MPX55, MPX65, and MNX55 are also added provide a bias current to transistor MNX45 to match the current to transistor MN45. Circuitry 46 thus causes transistor MNX45 to mimic transistor MN45 and, hence, its loading effect on the main amplifier, and provides this effect to the replica amplifier.

In this example, the supply voltages are $+1$ V and $-1$ V, for a 2 volt total possible output swing. The capacitors $C_1$ and $C_2$ in the circuitry are provided for stabilization.

In a representative embodiment, a CMOS operational amplifier as shown in FIG. 5(a) is implemented, for example, in a 1.2 micron CMOS technology. These minimum length transistors are employed for high speed and good output swing, except for transistors MP45 and MPX45 which are implemented with 1.8 micron transistors. The present invention can be used in conjunction with a cascode if desired.

Figure 6:
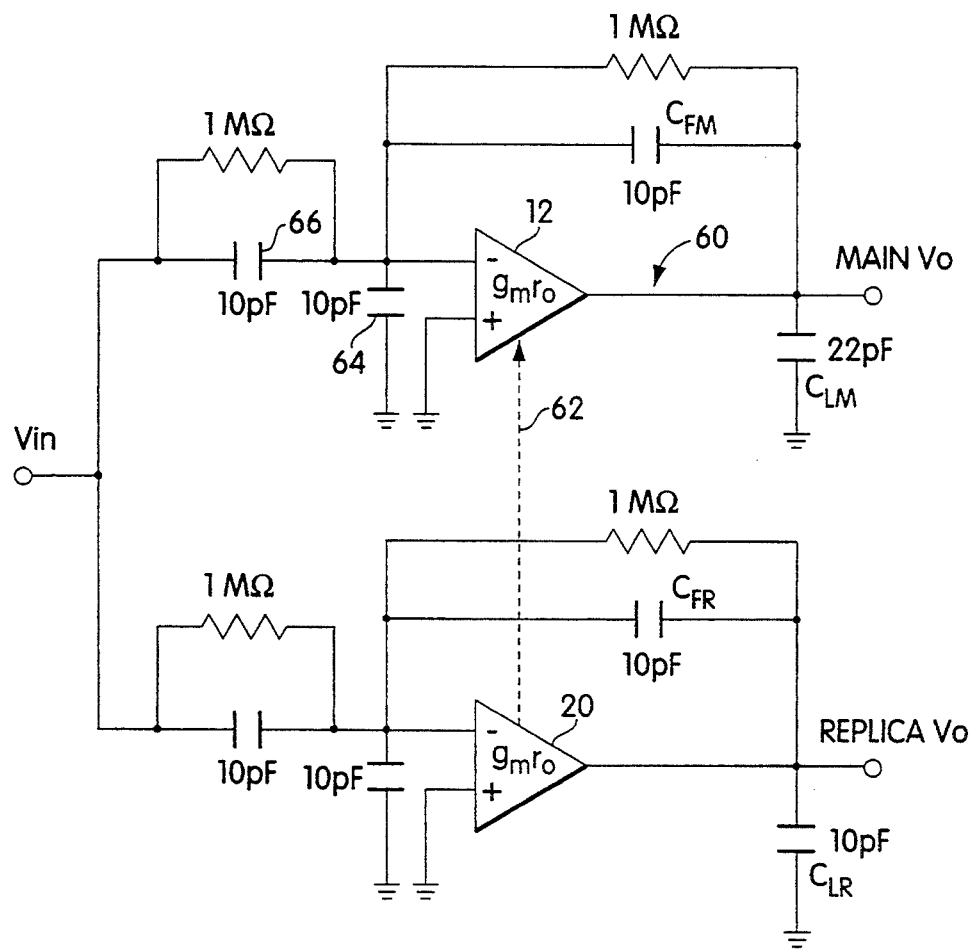
FIG. 6 is a partially schematic, partially block diagram of an embodiment of the invention used for testing.

The circuit in FIG. 6 is used for testing the performance of the amplifier. For ease of understanding, the coupling stage is not shown in full and is indicated only by dashed line 62, because the internal stages of the main and replica amplifiers are not shown. For the main amplifier 60, load capacitance $C_{LM}$ is 22 pF; adding that to the feedback capacitance $C_{FM}$, which is in series with the two parallel 10 pF capacitors 64 and 66 yields a total of 28.6 pF load capacitance to be driven by the main amplifier 12. For the replica amplifier, the load capacitance CLR is approximately 10 pF and the total load capacitance driven by replica amplifier 20 is 16.7 pF. The 1% settling time has been measured to be 55 ns. A summary of measured performance is provided in Table I as follows:

TABLE I

| Summary of Measured Performance | | |
|---|---|---|
| Parameter | W/o Rep Amp. | W/ Rep Amp |
| Supply Voltage | 1.0 v | 1.0 v |
| Output Swing | 100 mV from either rail | 100 mV from either rail |
| DC gain: | | |
| no load | 810 | 10,800 |
| 1 KΩ load | 200 | 10,500 |
| Power Dissipation | 4 mW | 9 mW |
| Settling Time (1%) [gain-of-3 circuit] | 55 ns | 55 ns |
| Gain-Bandwidth | 63 MHz | 63 MHz |
| Load Capacitance | 28.6 pF | 28.6 pF |
| Die Area | 0.34 mm$^2$ | 0.61 mm$^2$ |

Table I indicates different parameters with the replica amplifier present (right column) and with the replica amplifier absent (middle column). As indicated by the table, the effective DC gain is increased, using the replica amplifier, by a factor of about 13 with no load resistor, and a factor of 50 with a one kilohm load, without degrading other performance parameters. While the power dissipation and the die area are greater with the replica amplifier and coupling circuit than without, the power and area increase can be reduced by scaling down the replica amplifier as discussed above in connection with FIG. 4.

Figure 7:
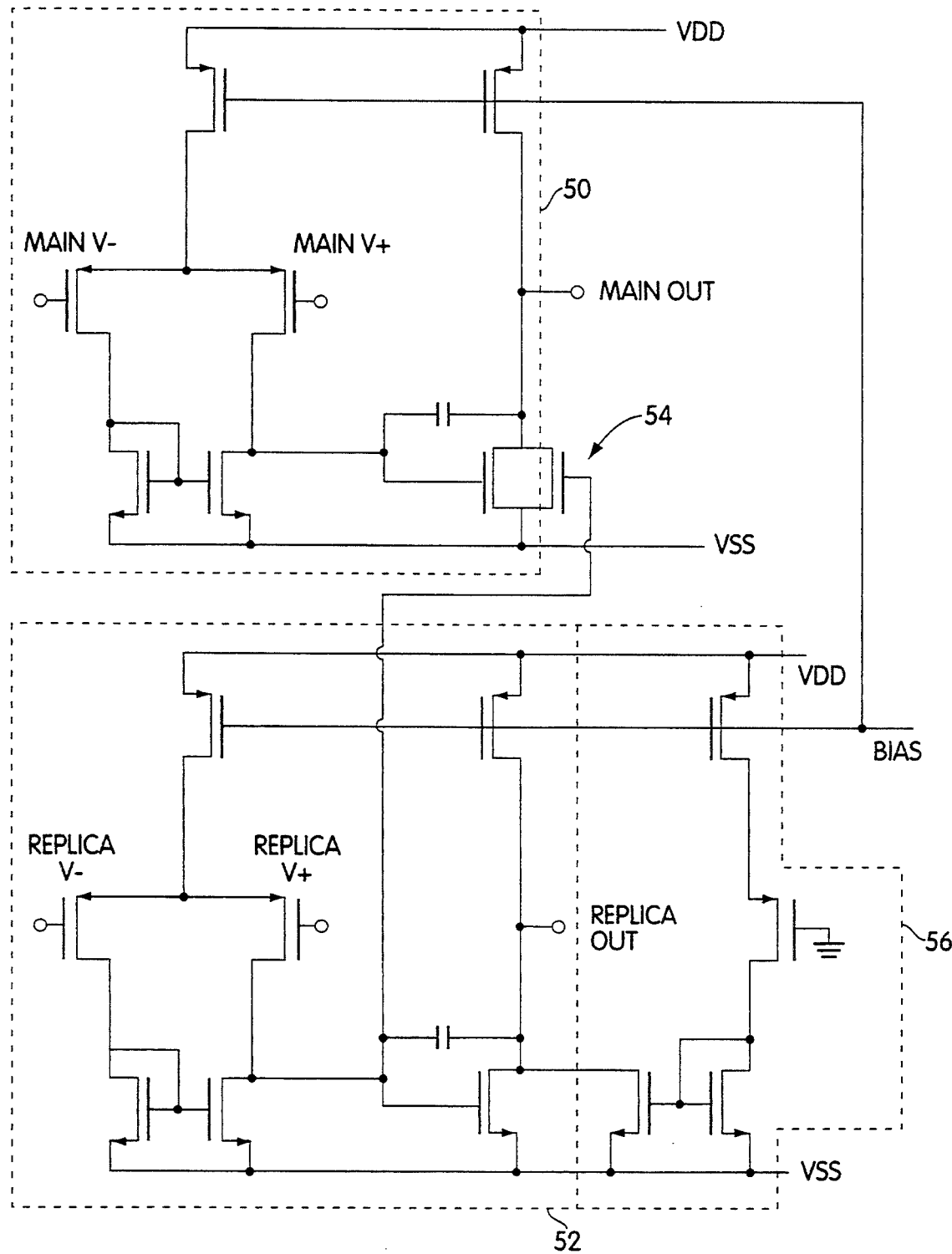
FIG. 7 is a schematic circuit diagram for an alternative implementation of the invention.

The principles of the present invention can be used with other designs, and in conjunction with other elements, such as the addition of a cascode transistor. For example, referring to FIG. 7, a replica amplifier 52 is coupled to a main amplifier 50 through transconductance stage 54. This embodiment is similar to that described in conjunction with FIG. 5(a), except that the input stages of both the main amplifier 50 and replica amplifier 52 are connected to receive differential inputs, and there are no transistors in series with capacitors $C_1$ and $C_2$.

Figure 8A:
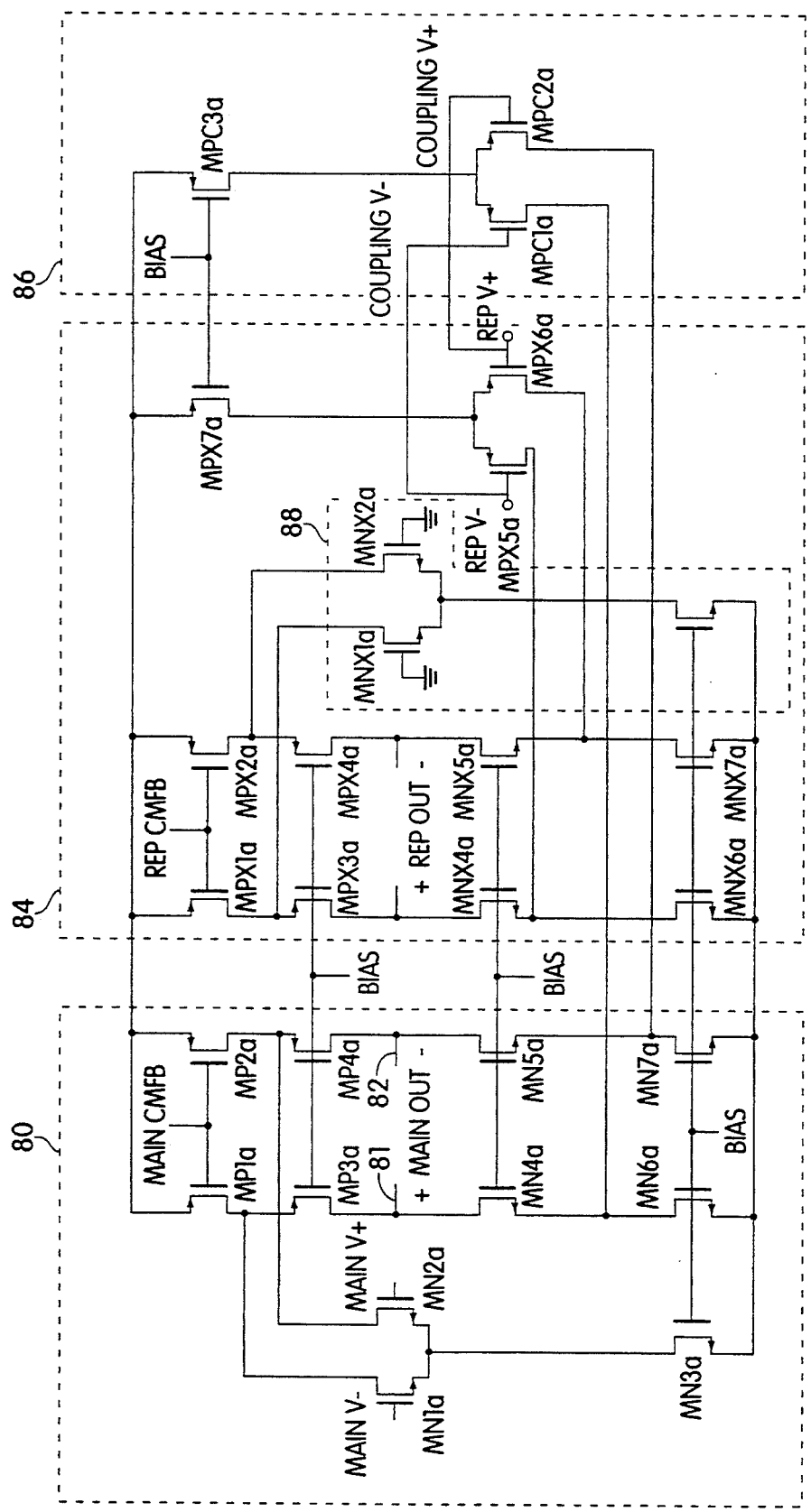
FIGS. 8(a) and 8(b) are schematic circuit diagrams of another embodiment of the present invention, employing a fully differential amplifier.

Referring to FIG. 8(a), the replica amplifier technique can be applied to other types of amplifiers, such as a folded-cascode topology. In main amplifier 80, the input differential pair formed by transistors MN1a and MN2a serve as the transconductance stage. These transistors convert the input voltage to a differential current which is conveyed to the output terminals 81 and 82 by transistors MP3a and MP4a. The current is converted to an output voltage by an implicit output resistance given by the parallel combination of the effective resistances looking into the drains of MP3a and MN4a for output terminal 81, and MP4a and MN5a for output terminal 82. Transistors MP1a, MP2a, MN4a, MN5a, MN6a, and MN7a are used as current sources. Since the amplifier has only one $g_m$ stage and one effective $r_o$ (output resistance), this folded-cascode topology is considered a single-stage topology.

Replica amplifier 84 has a corresponding input differential pair of transistors MPX5a and MPX6a which convert the voltage difference between Rep V and Rep $V_+$ to a current, and output resistances inherent from looking into the drains of transistors MPX3a, MNX4a, MPX4a, and MNX5a. In this example, the main amplifier and the replica amplifier have transconductance stages which comprise transistors of opposite polarity-type in that the main amplifier has NMOS transistors in the transconductance stage, while the replica amplifier has PMOS transistors in the transconductance stage.

The use of opposite polarity-type transistors demonstrates that although the main and replica amplifiers may be identical or at least substantially similar, only the critical parts of the amplifier need be substantially similar. As discussed in conjunction with FIG. 5(a), the product of the transconductance of the coupling amplifier and the output resistance of the main amplifier, and the product of the transconductance of the replica amplifier and the output resistance of the replica amplifier should match. Matching between the transconductance stages of the main amplifier and the replica amplifier is not necessarily required. Thus despite the opposite polarity transistors, the circuit of FIG. 8(a) still has an effective enhanced gain.

The input to differential transistor pair MPC1a and MPC2a of the coupling amplifier 86 is connected to the input to the differential transistor pair MPX5a and MPX6a of replica amplifier 84. In this case, since the coupling amplifier has a transconductance that is substantially similar to the transconductance of the replica amplifier, the coupling amplifier delivers a current to the output of the main amplifier that is substantially similar to the current which the replica transconductance stage delivers to the output of the replica amplifier. In this example, the output resistances of the main and replica amplifiers match.

Mimicking circuitry 88 includes transistors MNX1a and MNX2a, which form a differential pair biased by MNX3a. These transistors mimic the loading effect of the differential input stage of the main amplifier formed by transistors MN1a, MN2a, and current source transistor MN3a. Thus, the effective output resistance of the main and the replica amplifiers are matched. As in the circuit of FIG. 5(a), the output of the main amplifier is already close to the ideal voltage.- Hence, the input of the main amplifier only has to change by a small amount to bring the main output even closer to the ideal voltage, and to thus increase the effective open-loop gain of the main amplifier.

In the main amplifier, transistors MP3a, MP4a, MN4a, and MN5a are the cascode transistors. These transistors increase the output resistance and hence the open-loop gain. This increased gain is achieved at the expense of the output swing, which is reduced by the saturation voltages of the transistors. In applications in which the output swing can be reduced, or where a cascode topology is favored, the replica technique allows a further increase in gain without a further decrease in the output swing. The replica amplifier has similar corresponding cascode transistors.

Since this embodiment is a fully differential amplifier, a common mode feedback (CMFB) signal is added to keep the common mode range at a desired value, preferably close to zero. As is generally known, additional circuitry (not shown) is provided which monitors the output and feeds back a signal to the CMFB input terminal for each amplifier.

Figure 8B:
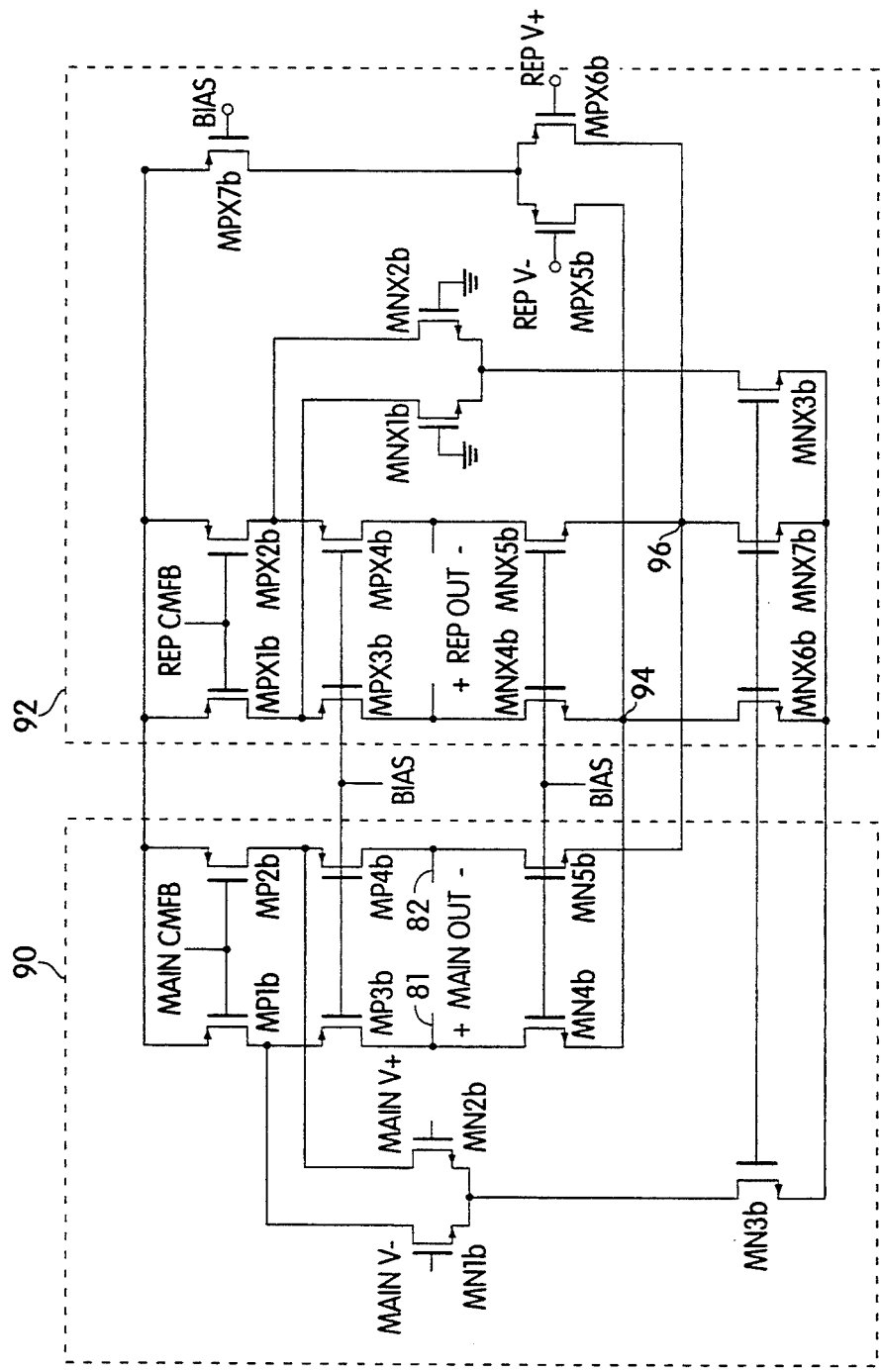

Referring to FIG. 8(b), the implementation in FIG. 8(a) can be simplified. Since the coupling amplifier input is connected to the replica amplifier input, the coupling amplifier and the replica amplifier can be merged into one correction circuit 92 which has a combined replica/coupling amplifier. The current from the replica/coupling transconductance stage is split between the main output and the replica output at nodes 94 and 96. Due to the relationship discussed above in conjunction with FIG. 5(a), if the output resistances are the same, then the coupling transconductance and the replica transconductance would be the same, and the current is split equally. This circuit achieves the same functionality as the circuit in FIG. 8(a). Since the circuit in FIG. 8(b) has a smaller number of transistors than the circuit in FIG. 8(a), it can require less area to implement.

Figure 8C:
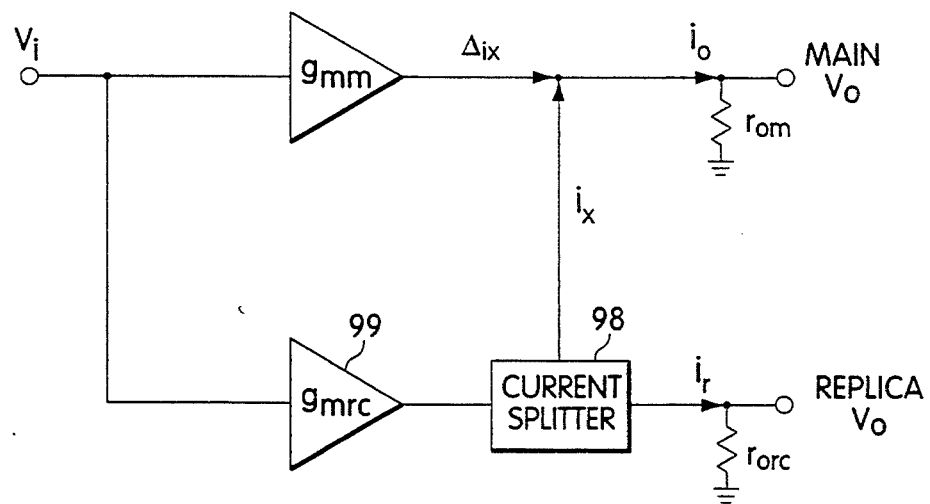
FIG. 8(c) is a partial schematic, partial block diagram representation of the circuitry of FIG. 8(b)

Referring to FIG. 8(c), the embodiment of FIG. 8(b) can be represented generally as having a main amplifier and a replica amplifier. The current output of combined transconductance stage 99 is provided to a current splitter 98 which provides current to the output resistance of the replica amplifier, $r_{orc}$, and to the output resistance of the main amplifier, $r_{om}$. To maintain a relationship so that the product of the current provided from the replica amplifier and the output resistance of the main amplifier equals the output voltage of the replica amplifier, the current is split in a ratio of $r_{om}:r_{orc}$. In effect, this representation of the circuitry of FIG. 8(b) is similar to previously described representations, such as FIG. 3, in which a coupling transconductance stage is explicitly indicated.

Figure 9:
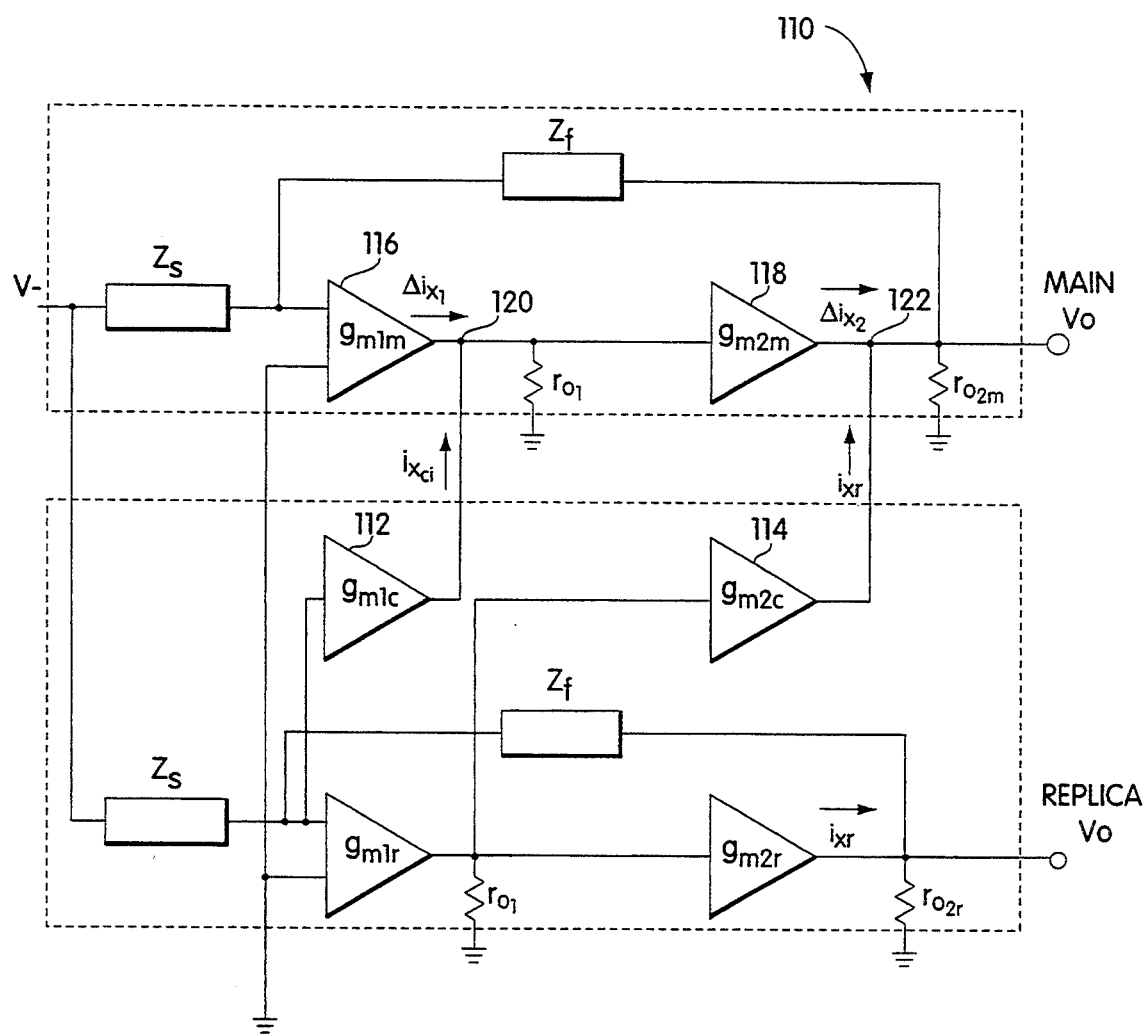
FIG. 9 is a partially schematic, partially block diagram of an alternative embodiment of the present invention.

Referring to FIG. 9, circuit 110 is an alternative embodiment that is generally similar to that of FIG. 5(b) except that it has two transconductance coupling stages 112, 114. The current from stages 112, 114 are combined with the output currents from respective transconductance stages 116, 118, at respective summing nodes 120, 122.

Having described various embodiments of the present invention, it will become apparent to those skilled in the art that still other variations are possible without departing from the scope of the invention as defined by the appended claims. For example, it should be understood that the principles here could be applied to non-electrical feedback systems, and that gain, ideal or actual, is not necessarily greater than one, but may be one or less than one. In addition, the circuit described above can be incorporated in amplifier circuits with additional stages and elements.

What is claimed is:

1. An amplifier assembly comprising:
   a first amplifier for receiving an amplifier input signal from an input source and for providing a first amplified output signal in response thereto, the first amplifier including
      a transconductance stage for receiving a first input signal derived from the amplifier input signal, and for providing a first output signal at an output lead in response thereto, and
      an output resistance stage for receiving an input signal and for providing an output signal;
   a first feedback network coupled to the first amplifier, the first feedback network coupling the amplified output signal and the amplifier input signal;

a second amplifier for receiving a second input signal derived from the amplifier input signal and for providing a second amplified output signal, the second amplifier including a transconductance stage which receives a second input signal which is derived from the amplifier input signal;

a transconductance coupling stage for receiving the second input signal and for providing a coupling output signal; and means for combining the coupling signal and the first output signal and for providing the combination as the input signal to the output resistance stage, wherein the amplified output signal is derived from the output signal from the output resistance stage.

2. The amplifier assembly of claim 1 wherein the transconductance coupling stage includes a transistor which has one electrode coupled to the transconductance stage of the second amplifier, and another electrode coupled to the means for combining.

3. The amplifier assembly of claim 1 wherein the second amplifier has an output resistance stage which receives the output signal of the transconductance stage of the second amplifier as an input signal and which provides an output signal, wherein the value of the transconductance of the transconductance coupling stage is $g_{mc}$ and the value of the output resistance stage of the first amplifier is $r_{o1}$, and wherein the open loop gain of the second amplifier is substantially equal to $(g_{mc})(r_{o1})$.

4. The amplifier assembly of claim 3 further comprising a second feedback network connecting the second amplified output signal and the amplifier input signal.

5. The amplifier assembly of claim 4 wherein the transconductance coupling stage causes electrical effects on the first amplifier, the assembly further comprising mimicking circuitry coupled to the second amplifier for providing electrical effects on the second amplifier which simulate the effects of the transconductance coupling stage on the first amplifier.

6. The amplifier assembly of claim 4 wherein as supply voltage range is about 2 volts or less.

7. The amplifier assembly of claim 1 wherein the unity-gain bandwidth of the second amplifier is greater than the unity-gain bandwidth of the first amplifier.

8. The amplifier assembly of claim 1 wherein the first amplifier includes a third stage for receiving an input signal derived from the amplifier input signal and for providing the first input signal as an output signal, the third stage including a transconductance stage and an output resistance stage.

9. The amplifier assembly of claim 1 wherein the output resistance stage includes a first transistor, the assembly further comprising a cascode transistor for increasing the effective resistance of the output resistance stage.

10. The amplifier assembly of claim 1 wherein the first feedback network includes a circuit having an impedance coupled to receive the amplifier input signal and to provide an output signal.

11. The amplifier assembly of claim 10 wherein the first amplifier further comprises at least a third stage for receiving the output signal from the circuit having the impedance, and for providing the first input signal as an output signal.

12. The amplifier assembly of claim 11 wherein the third stage comprises a transconductance stage and an output resistance stage.

13. The amplifier assembly of claim 1 wherein the transconductance coupling stage causes electrical effects on the first amplifier, the assembly further comprising mimicking circuitry coupled to the second amplifier for providing electrical effects on the second amplifier which simulate the effects of the transconductance coupling stage on the first amplifier.

14. The amplifier assembly of claim 1 wherein a supply voltage range is about 2 volts or less.

15. An amplifier assembly for coupling to an input source which provides a first amplifier input signal at an amplifier input lead and for providing an amplified output signal at an amplifier output lead in response thereto, the assembly comprising:

an amplifier having
a first stage for receiving an input signal derived from the first amplifier input signal and for providing a first stage output signal,
a second stage for receiving the first stage output signal and for providing the amplified output signal, and
a feedback network for directly coupling the amplifier output lead and the amplifier input lead;

a correction circuit for receiving a second amplifier input signal which is substantially similar to the first amplifier input, and for providing a correction circuit output signal that is independent of the first feedback network; and means for combining the correction circuit output signal and the first stage output signal and for providing the combined output signal to the second stage.

16. The amplifier assembly of claim 15 wherein the first stage output signal is much smaller than the correction circuit output signal.

17. The amplifier assembly of claim 16 wherein the first stage includes a transconductance stage for receiving the input signal as a voltage and for providing an output current to the second stage, wherein the correction circuit output signal has a current, and wherein the means for combining is a common node.

18. An amplifier assembly for coupling to an input source which provides a first amplifier input signal and for providing an amplified output signal in response thereto, the assembly comprising:

an amplifier having
a first stage for receiving an input signal derived from the first amplifier input signal and for providing a first stage output signal,
a second stage for receiving the first stage output signal and for providing the amplified output signal, and
a feedback network for coupling the amplified output signal and the amplifier input signal;

a correction circuit for receiving a second amplifier input signal which is substantially similar to the first amplifier input, and for providing a correction circuit output signal; and means for combining the correction circuit output signal and the first stage output signal and for providing the combined output signal to the second stage;

wherein the correction circuit comprises:
first and second stages which are substantially similar to the first and second stages of the amplifier, respectively, and
a coupling stage, the first stage of the correction circuit and the coupling stage each receiving an input signal derived from the amplifier input signal wherein the output of the coupling stage being the correction circuit output signal.

19. The amplifier assembly of claim 18 wherein the correction circuit provides an amplified output signal at an output terminal, and wherein the correction circuit has a feedback network for coupling the output terminal of the correction circuit and an input terminal of the first stage of the correction circuit.

20. An amplifier assembly for coupling to an input source which provides a first amplifier input signal at an amplifier input lead and for providing an amplified output signal at an amplifier output lead in response thereto, the assembly comprising:
an amplifier having
a first stage for receiving an input signal derived from the first amplifier input signal and for providing a first stage output signal,
a second stage for receiving the first stage output signal and for providing the amplified output signal, and
a feedback network for coupling the amplifier output lead and the amplifier input lead;
a correction circuit for receiving a second amplifier input signal which is substantially similar to the first amplifier input, and for providing a correction circuit output signal; and
means for combining the correction circuit output signal and the first stage output signal and for providing the combined output signal to the second stage, wherein the correction circuit output signal is about the same as the first stage output would have been without the correction circuit being coupled.

21. An amplifier assembly for coupling to an input source which provides a first amplifier input signal and for providing an amplified output signal in response thereto, the assembly comprising:
an amplifier having
a first stage for coupling to the input source for receiving an input signal derived from the first amplifier input signal and for providing a first stage output signal,
a second stage for receiving the first stage output signal and for providing the amplified output signal, and
a feedback network for coupling the amplified output signal and the first amplifier input signal;
a correction circuit for receiving a second amplifier input signal similar to the first amplifier input signal, and for providing a correction circuit output signal independent of the feedback network; and
means for combining the correction circuit output signal and the first stage output signal and for providing the combined output signal to the second stage,
wherein the correction circuit output signal is much larger than the first stage output signal.

22. The assembly of claim 21 wherein the correction circuit provides a second amplified output signal, the correction circuit comprising:
a first stage for receiving an input signal derived from the second amplifier input signal and for providing a first stage correction output signal,
a second stage for receiving the first stage correction output signal and for providing a second stage correction output signal, and a feedback network for coupling the second amplified output signal and the input signal to the first stage, wherein the second amplified output signal is derived from the second stage correction output signal.

23. The assembly of claim 22 wherein the correction circuit includes a coupling stage for receiving the input signal to the correction circuit and for providing the correction circuit output signal to the means for combining.

24. The assembly of claim 25 wherein
the first stage of the correction circuit has a transfer function A,
the second stage of the correction circuit has a transfer function B,
the coupling stage has a transfer function C, and the second stage of the amplifier has a transfer function D; and wherein
$f(A, B) = f(C, D)$.

25. The assembly of claim 24 wherein $f(A, B) = (A)(B)$.

26. The amplifier assembly of claim 21 wherein the correction circuit comprises:
a third stage for receiving an input signal derived from the second amplifier input signal and for providing an output; and
means for providing at least part of the output from the third stage of the correction circuit as the correction circuit output signal.

27. The assembly of claim 21 wherein
the correction circuit has a plurality of stages which provide a correction system output which is related to the input signal to the correction circuit by a correction circuit transfer function;
wherein the correction circuit includes means for coupling the input signal to the correction circuit to the means for combining;
wherein the means for coupling and the second stage of the amplifier have a combined coupling transfer function; and
wherein the correction circuit transfer function is substantially similar to the combined coupling transfer function.

28. An amplifier assembly for coupling to an input source and for providing an amplified output signal in response thereto comprising:
an amplifier having
a first stage for coupling to the input source for receiving an input signal and for providing a first stage output signal,
a second stage for receiving the first stage output signal and for providing an output signal from which the amplified output signal is derived, and
a feedback network for coupling the amplified output signal and the input signal;
a correction circuit having
a first stage for receiving an input signal similar to the input signal received by the first stage of the amplifier and for providing a first stage correction output signal independent of the feedback network, and
means for splitting the first stage correction output signal into a coupling signal and a noncoupling signal; and
means for combining the coupling signal and the first stage output signal and for providing the combined output signal to the second stage.

29. An amplifier assembly comprising:

an amplifier for receiving an amplifier input from an input source at an input lead and for providing an amplified output at an output, lead the amplifier having
- a first amplifying stage including
  - a first transconductance stage for receiving a first stage voltage input which is derived from the amplifier input and for providing a first output current,
  - a first output resistance stage for receiving a first input current and for providing the first stage voltage output,
- a second amplifying stage including
  - a second transconductance stage for receiving the first stage voltage output as an input signal, and for providing a second stage output current, and
  - a second output resistance stage for receiving a second input current derived from the second stage output current and for providing the amplified output, and
- a first feedback network for directly coupling the input lead and the output lead;

a correction circuit for receiving the amplifier input at an input lead and for providing a correction circuit output combined current at a first output lead and a second amplified output voltage signal at a second output lead; and means for combining the correction circuit output current and the first stage output current and for providing the current as the first input current to the first output resistance stage.

30. The assembly of claim 29 wherein the correction circuit includes
- a first amplifying stage for receiving a correction circuit voltage input signal which is derived from the amplifier input and for providing a first stage correction circuit voltage output,
- a second amplifying stage for receiving the first stage correction circuit voltage output and for providing the second amplified output at the second output lead, and
- a second feedback network for coupling the second output lead and the correction circuit input lead.

31. The assembly of claim 30 wherein the first amplifier :stage of the correction circuit includes a first correction circuit output resistance stage and a first correction circuit transconductance stage, the first correction circuit transconductance stage for receiving the correction circuit voltage input signal, for providing the correction circuit output current to the combining means, and for providing a first correction circuit transconductance stage output current to the first correction circuit output resistance stage.

32. The assembly of claim 31 wherein the second amplifier stage of the correction circuit includes a second correction circuit output resistance stage and a second correction circuit transconductance stage, the second correction circuit transconductance stage for receiving the first stage correction circuit voltage output, for providing a second correction circuit output current, and for providing a second correction circuit transconductance stage output current to the second correction circuit output resistance stage,
the assembly further comprising a second means for combining the second correction circuit output current and the second stage output current and for providing the second combined current to the second output resistance stage.

33. An amplifier assembly comprising:
an amplifier for receiving an amplifier input from an input source at an input terminal and for providing an amplified output at an output terminal, the amplifier having
- a first amplifying stage including
  - a first transconductance stage for receiving a first stage voltage input which is derived from the amplifier input and for providing a first output current,
  - a first output resistance stage for receiving the first output current and for providing the first stage voltage output,
- a second amplifying stage including
  - a second transconductance stage for receiving the first stage voltage output as an input, and for providing a second stage output current, and
  - a second output resistance stage for receiving the second stage output current and for providing the amplified output, and
- a first feedback network for coupling the input terminal and the output terminal;

a correction circuit for receiving the amplifier input and for providing a, correction circuit output current; and means for combining the correction circuit output current and the second stage output current and for providing the combined current to the second output resistance stage.

34. The assembly of claim 33 wherein the correction circuit receives the amplifier input at a correction circuit input terminal and provides a second amplified output signal at a correction circuit output terminal, the correction circuit comprising
- a first amplifying stage for receiving a correction circuit voltage input signal which is derived from the amplifier input and for providing a first stage correction circuit voltage output,
- a second amplifying stage for receiving the first stage correction circuit voltage output and for providing the second amplified output at the correction circuit output terminal, and
- a second feedback network for coupling the correction circuit output terminal and the correction circuit input terminal.

35. An amplifier assembly comprising:
a first amplifier for receiving an amplifier input signal from an input source and for providing a first amplified output signal in response thereto, the first amplifier including:
- a transconductance stage for receiving a first input signal which is derived from the amplifier input signal, and for providing a first output signal at an output lead in response thereto, and
- an output resistance stage for receiving an input signal derived from the first output signal and for providing an output signal;
- a first feedback network coupled to the first amplifier, the first feedback network connecting the amplified output signal and the amplifier input signal;

a second amplifier for receiving a second amplifier input signal derived from the input source and for providing a second amplified output signal in response thereto, the second amplifier including a transconductance stage for receiving a signal derived from the second amplifier input signal and for providing an output current in response thereto; and a current splitter for receiving a current derived from the output current and for providing a first output current and a second output current, the first output current being coupled to the first amplifier in order to be combined with the first output signal of the first amplifier, the second amplifier output signal being derived from the second output current.

36. An amplifier assembly comprising:
a first amplifier having an input lead for receiving an input signal, and for providing an amplified output at an amplifier output lead in response thereto, the first amplifier including:
a first differential stage having a first input lead for receiving an input voltage derived from the input signal, the first differential stage for providing a first output voltage, and
a first transconductance stage for receiving a voltage derived from the first output voltage, and for providing a first output current in response thereto;
a second amplifier including:
a second differential stage having a first input lead for receiving a second input voltage derived from the input signal, the second differential stage for providing a second output voltage, and
a second transconductance coupling stage for receiving a voltage derived from the second output voltage, and for providing a second output current,
the first and second output currents being combined by a summing node, wherein the amplifier output signal is derived from the sum of the first and second output currents.

37. The amplifier assembly of claim 36, wherein the first differential stage and the second differential stage each has a second lead coupled to a fixed reference voltage.

38. The amplifier assembly of claim 36, wherein a first feedback circuit is directly coupled to the amplifier output lead and to the input lead of the first amplifier.

39. A circuit for coupling to an amplifier to increase the gain of the, amplifier, the amplifier for receiving an input signal at an amplifier input lead and for providing an amplified voltage signal and at an amplifier output lead, the amplifier having a first stage for receiving a first input voltage signal and for providing a first output voltage signal in response thereto, and a first transconductance stage for receiving an input voltage signal derived from the first output voltage and for providing a first output current in response thereto, wherein the amplified voltage signal is derived from the first output current when the amplifier is not coupled to the circuit so that the amplifier has a first open loop gain, the circuit comprising:
an input lead for coupling to an input source for receiving a second input voltage signal derived from the input source;
means for receiving an input voltage signal derived from the second input voltage signal and for providing a second output current in response thereto, the second output current being substantially equal to the first output current when the circuit is not coupled to the amplifier; and
means for combining the first output current and the second output current to produce a combined output current, wherein the amplified voltage signal is derived from the combined output current and has a second open loop gain, wherein the second open loop gain is substantially greater than the first open loop gain.

40. The circuit of claim 39, wherein a feedback network directly couples the amplifier input lead and the amplifier output lead.

* * * * *